(12) United States Patent
Baker

(10) Patent No.: US 6,809,981 B2
(45) Date of Patent: Oct. 26, 2004

(54) WORDLINE DRIVEN METHOD FOR SENSING DATA IN A RESISTIVE MEMORY ARRAY

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 10/118,891

(22) Filed: Apr. 10, 2002

(65) Prior Publication Data

US 2003/0193830 A1 Oct. 16, 2003

(51) Int. Cl.[7] ............................................... G11C 11/02
(52) U.S. Cl. .................................... 365/225.5; 365/158
(58) Field of Search ............................. 365/225.5, 100, 365/105, 171, 173, 158

(56) References Cited

U.S. PATENT DOCUMENTS

| | | | |
|---|---|---|---|
| 6,259,644 B1 | * | 7/2001 | Tran et al. .................. 365/209 |
| 6,462,979 B2 | * | 10/2002 | Schlosser et al. ........... 365/158 |
| 6,490,190 B1 | * | 12/2002 | Ramcke et al. ............. 365/158 |
| 2002/0126524 A1 | * | 9/2002 | Sugibayashi et al. ....... 365/158 |
| 2002/0135018 A1 | * | 9/2002 | Hidaka ....................... 257/359 |
| 2002/0136047 A1 | * | 9/2002 | Scheuerlein ................. 365/96 |
| 2003/0002333 A1 | * | 1/2003 | Hidaka ....................... 365/171 |

* cited by examiner

Primary Examiner—Richard Elms
Assistant Examiner—J. H. Hur
(74) Attorney, Agent, or Firm—Dickstein Shapiro Morin & Oshinsky LLP (57) ABSTRACT

A memory device having an array of resistive memory cells with row lines that are maintained at ground potential during quiescent operation of the device. During a read operation, one of the row lines is adapted to be coupled to a non-ground potential. Such coupling configures a memory cell of the array to be sensed in a voltage divider with a column line coupled to a common node of the voltage divider. An amplifier adapted to amplify a voltage detected on the column line is provided and additional circuitry is provided to translate the amplified voltage of the amplifier as a logic state of digital data stored in the device.

34 Claims, 7 Drawing Sheets

WORDLINE DRIVEN METHOD FOR SENSING DATA IN A RESISTIVE MEMORY ARRAY

BACKGROUND OF THE INVENTION

1. Field of the Invention

The present invention relates to the reading of resistor-based memory devices such as magnetic resistive random access memory (MRAM) devices which store logic values as resistive states in a memory cell.

2. Description of the Related Art

Figure 1:
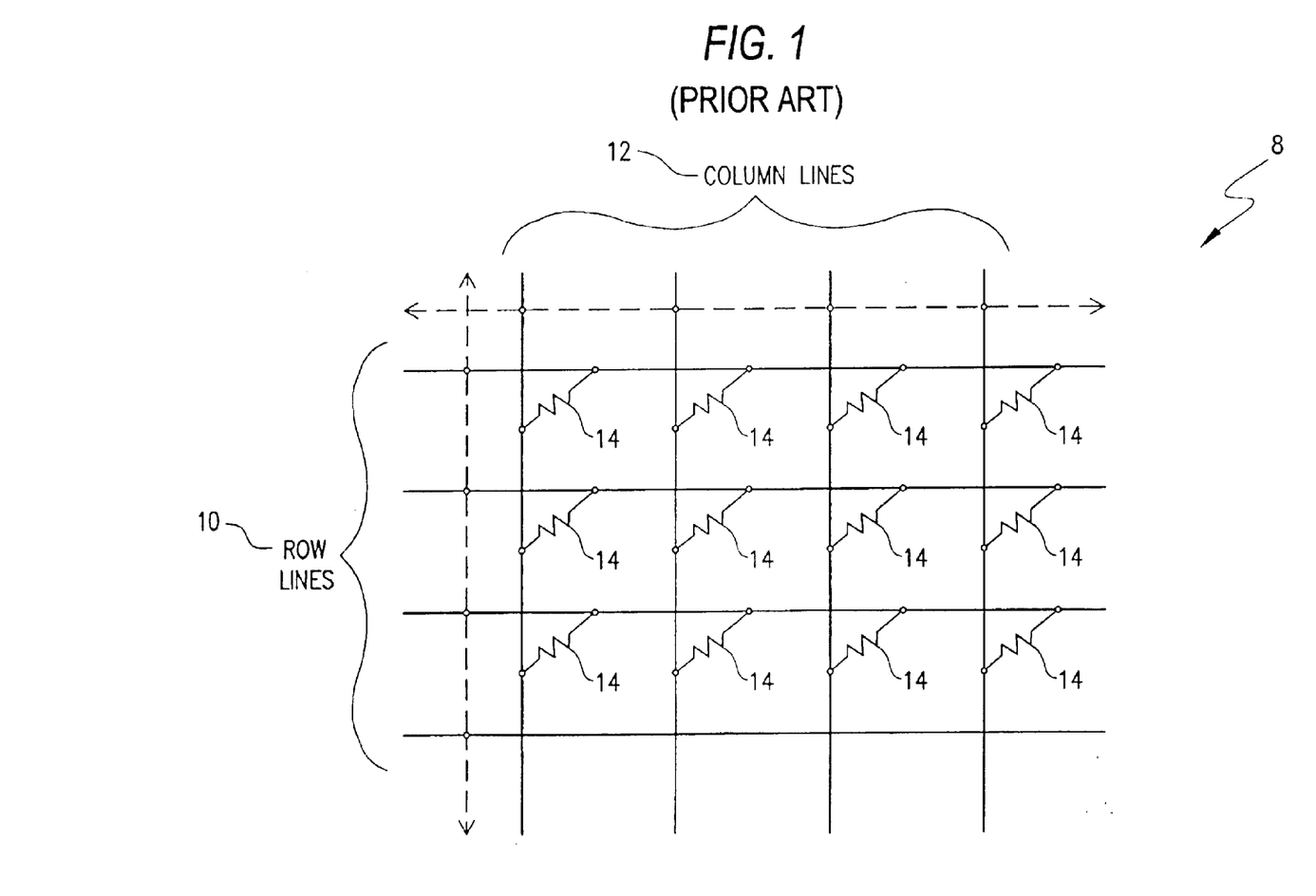
FIG. 1 shows a conventional magnetic random access memory array in electrical schematic form.

FIG. 1 shows one example of a resistor based memory array architecture called a crosspoint array architecture. The memory array 8 includes a plurality of row lines 10 arranged in orgthogonal orientation to a plurality of column lines 12. Each row line is coupled to each of the column lines by a respective resistive memory cell 14. Each memory cell stores one of two or more logical values depending on which of a plurality of resistance values it is programmed to exhibit.

An MRAM device is one approach to implementing a resistance based memory. In an MRAM, each resistive memory cell typically includes a pinned magnetic layer, a sense magnetic layer and a tunnel barrier layer between the pinned and sense layers. The pinned layer has a fixed magnetic alignment and the magnetic alignment of the sense layer can be programmed to different orientations. The resistance of the cell varies, depending on the magnetic alignment of the sense layer. One resistance value, e.g., a higher value, may be used to signify a logic "one" while another resistance value, e.g., a lower value, may be used to signify a logic "zero". Stored data can be read by sensing the resistance of the cells, and interpreting the resistance values thus sensed as logic states of the stored data.

For MRAM sensing purposes, the absolute magnitude of memory cell resistance need not be known; only whether the resistance is above or below a threshold value that is intermediate to the logic one and logic zero resistance values. Nonetheless sensing the logic state of an MRAM memory element is difficult because the technology of the MRAM device imposes multiple constraints. In particular, the need for high storage density and low cost motivates minimizing the number of transistors in the memory array. A cell of a crosspoint array, as discussed above, does not include a transistor. As a result, each resistive element remains operatively connected to respective row and column lines at all times. Consequently, as a memory cell is sensed it is shunted by a significant leakage current path. In a conventional MRAM device, an element in a high resistance state may have a resistance of about 1 M$\Omega$, while an element in a low resistance state may have a resistance of about 950 K$\Omega$. The differential resistance between a logic one and a logic zero is thus about 50 K$\Omega$, or 5% of scale. Rapidly distinguishing a 5% resistance differential on a scale of 1 M$\Omega$ in the face of low resistance leakage paths and with a minimum of circuitry is a challenge. While various schemes have been proposed for sensing the resistance of resistive memory cells, room for improvement remains.

Figure 2:
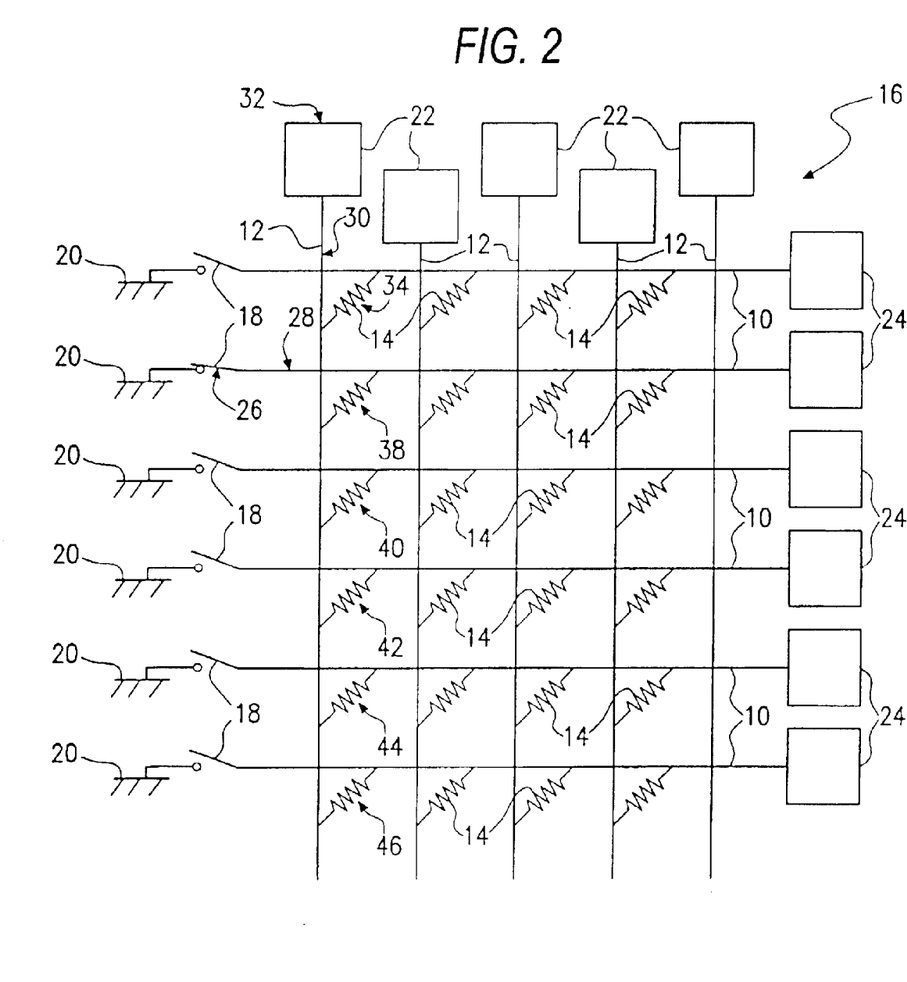
FIG. 2 shows one technique for sensing cell resistance in a magnetic random access memory array.

In one previously considered approach to MRAM cell sensing, the rows and columns of an array of MRAM memory cells are quiescent at a potential known as array voltage that is different from ground potential. During a data read, one of the row lines is grounded and a resulting current flow, through a column line and through a connected target memory cell, is measured. An MRAM memory array according to this approach is illustrated in FIG. 2. FIG. 2 shows a plurality of row lines 10 connected to a respective plurality of voltage sources 24. Each row line is operatively connected to a plurality of memory cells 14. The memory cells are connected to a respective plurality of column lines 12, and the column lines are connected to respective sensing circuits 22 to detect current flowing into the respective column lines. When one row line 28 of the plurality of row lines 10 is switchingly grounded, as shown at 26, current flows through the memory cells connected to that grounded row line 28.

Figure 3:
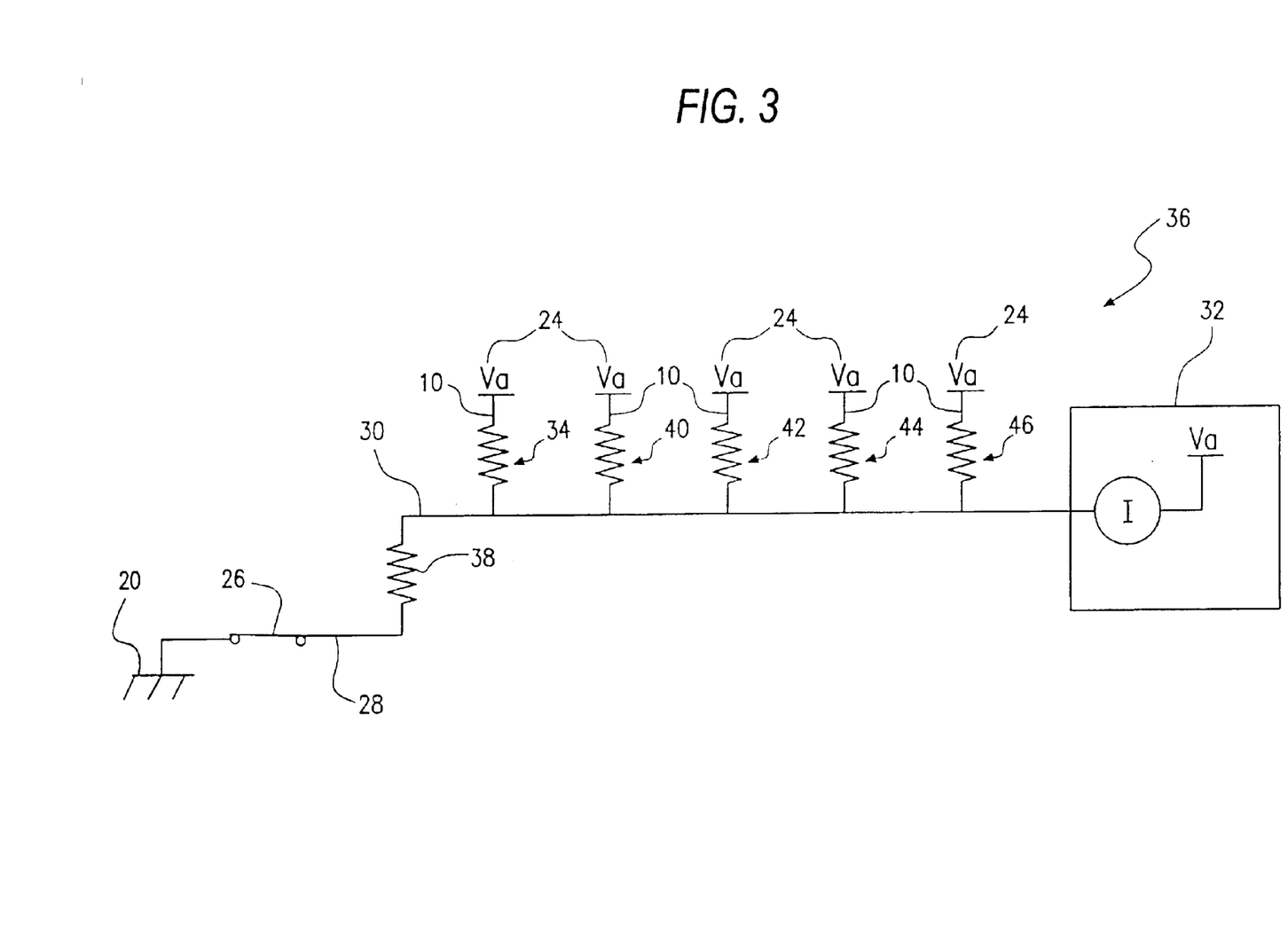
FIG. 3 shows a portion of the FIG. 2 array during cell sensing.

FIG. 3 shows one particular memory cell 38 connected to the grounded row line 28. The current flowing through memory cell 38 is sourced by a particular column line 30, and detected by a particular sensing circuit 32 connected to the particular column line 30. By sensing the magnitude of the current in the particular column line 30, the particular sensing circuit 32 determines the resistance, and thus the programmed logic state, of memory cell 38.

When the switch 26 grounds row line 28 current flows through memory cell 38 and column line 30. Sensing circuit 32 detects this current and ascertains the logic state of memory cell 38. Other memory elements, e.g., 34, 40, 42, 44, and 46 are also connected to the column line 30. Leakage current through these other memory elements is minimized by maintaining the respective row lines 10, to which these other memory elements are connected, at array voltage (Va) 24 which is substantially the same as the voltage of column line 30. Nevertheless, some current flows through the other memory elements because of imperfect control of the array voltage delivered by column line 30. Also, because the entire array, except for a momentarily grounded row line, is maintained at array voltage (Va), leakage current from the array causes some dissipation of energy on an ongoing basis.

BRIEF SUMMARY OF THE INVENTION

The present invention provides an MRAM sensing system which maintains a quiescent memory array at ground potential. According to the present invention the column lines of the array are allowed to float; that is they are not directly connected to a source of constant potential such as ground or array voltage (Va). The row lines are switchingly connected alternately between a source of ground potential and a source of array voltage Va. The default connection is to ground. Consequently, under default conditions any charge disposed on the floating column lines is dissipated through the memory cells, and thereafter through the row lines, to ground. In the resulting quiescent state, the entire array (row lines, memory elements, and column lines), is at ground potential and draws no current.

When the stored logical state of a particular memory cell is to be sensed, the row line to which that particular memory cell is directly connected is switched to a source of array voltage (Va). In the resulting circuit configuration, the memory cell to be sensed forms a voltage divider with respect to the other memory cells connected to the same column line. Current flows through the memory cell to be sensed to the sensed column line to which it is connected, and from that column line through the other memory cells connected to that column line to a ground potential node.

As this current flows through the voltage divider thus formed, a sensing voltage develops on the sensed column line related to the logical state of the particular memory cell being sensed. An amplifier connected to the sensed column line detects and amplifies this voltage to discriminate the logic state of the particular memory cell.

These and other aspects and features of the invention will be more clearly understood from the following detailed description which is provided in conjunction with the accompanying drawings.

DETAILED DESCRIPTION OF THE INVENTION

Figure 4:
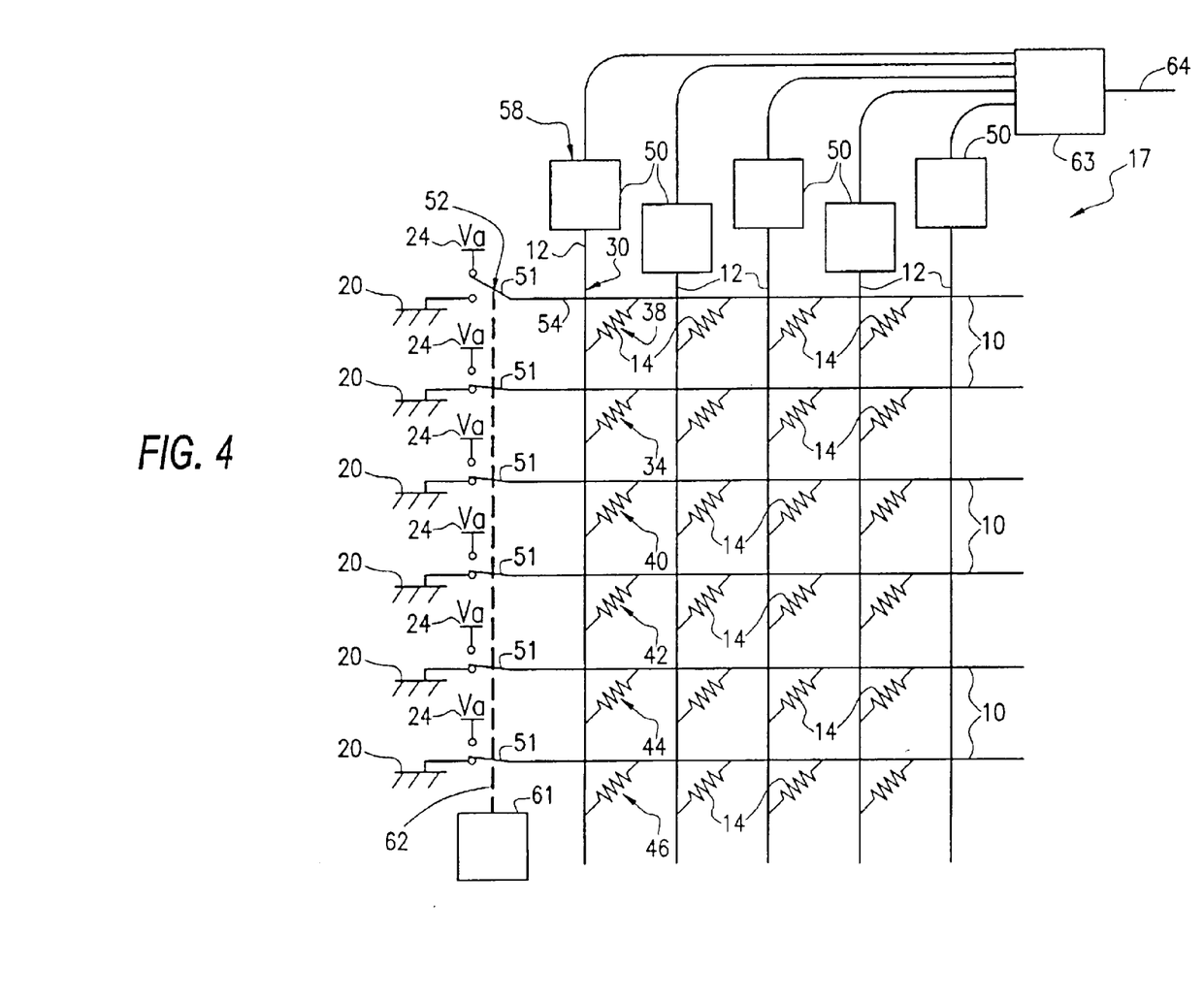
FIG. 4 shows a magnetic random access memory array according to an embodiment of the invention.

FIG. 4 shows an exemplary embodiment of an MRAM device according to the invention. The device includes an array 17 of MRAM cells 14, a plurality of spaced electrically conductive row lines 10, and a plurality of spaced electrically conductive column lines 12. As shown, the plurality of row lines 10 is disposed substantially orthogonally to the plurality of column lines 12, defining a plurality of overlap regions at the respective crossings. In other embodiments, the row and column lines can be disposed in oblique spaced relation to one another. Each row line is connected to each of the plurality of column lines by a respective plurality of MRAM resistive cells 14. A plurality of switching devices 51, typically implemented as transistor devices, are each switchingly connected between one of the row lines 10 and both a first source of constant potential (ground) 20 and a second source of constant potential (array voltage Va) 24 under the control of a control circuit 61. The control circuit 61 includes a row decoder and is coupled as illustrated by 62 to each of the plurality of switching devices 51. The switching devices 51 are adapted to alternately connect the row lines 10 to ground 20 and to Va 24. The control circuit 61 maintains each of the plurality of switching devices 51 in a default condition such that the respective row line is grounded. When a row select is required, the control circuit 61 signals a respective switch 51 of the selected row line to transition and connect the selected row line to a source of array voltage 24. This state is shown, for example, by the selected switching device 52. A plurality of sensing circuits 50 are respectively connected to the plurality of column lines 12. As will be further discussed below, the sensing circuits each include an amplifier.

The sensing circuits each include an output connected to a respective input of a latch multiplexer and buffer 63 adapted to multiplex the outputs of the sensing circuits 50 onto an output line 64.

A power supply, typically external to the integrated circuit, provides a source of electrical voltage that maintains the various electrical potentials at which the circuit operates. The power supply defines at least two potentials including a ground potential 20 and an elevated potential referred to as array voltage Va 24 connected as indicated above. In one aspect of the invention Va has a voltage of approximately 5 volts. In another aspect of the invention, the substrate of the MRAM device is maintained at ground potential 20 by connection to a ground potential node of the power supply.

Possible states of the memory array 17 during operation include quiescent, reading, and writing states. The quiescent state includes a state in which no memory cell is being written and no memory cell is being read. When the array is in a quiescent state, every row line 10 of the array is operatively connected to a source of ground potential by means of the respective switching device 51. At the same time, all column lines 12 are at ground potential, having discharged any previous charge to ground through the memory elements 14 and row lines 10.

When a read cycle starts, the control circuit 61 signals a row selection to a particular one 52 of the switching devices 51. As discussed above, the particular switching device 52 changes state so as to disconnect a selected row line 54 from ground 20 and operatively connect that row line 54 to Va 24. In response, charge flows from Va 24 onto the selected row line 54, rapidly raising the potential of the row line 54 to Va 24.

Figure 5:
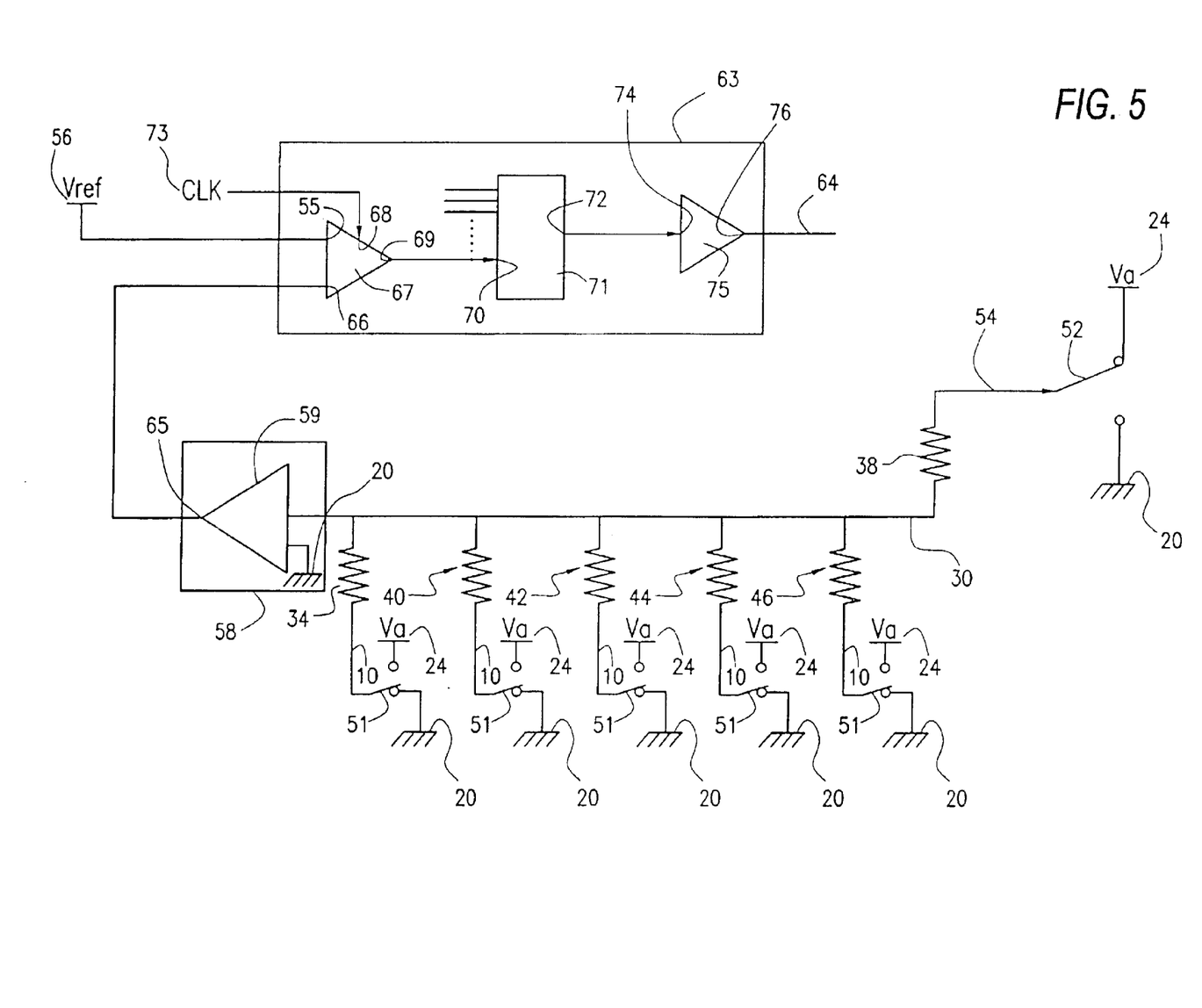
FIG. 5 shows a portion of the FIG. 4 magnetic random access memory array.

FIG. 5 shows this aspect of the circuit configuration discussed immediately above. In FIG. 5, selected row line 54 is shown operatively connected to Va 24 by selected switching device 52. A particular addressed column line 30 of the plurality of column lines 12 is also shown. The particular memory cell 38 that connects the selected row line 54 and the particular column line 30 is also illustrated. A respective sensing circuit 58 including an amplifier 59 is operatively connected to column line 30 for sensing the voltage of column line 30 with respect to a reference potential such as ground 20. It should be noted that in one aspect of the invention, the source of reference potential 20 includes a ground connection of an external power supply. In another aspect of the invention the source of reference potential 20 includes a discharged capacitance such as a previously discharged column line 30 of another memory array. As illustrated, sneak path memory cells, e.g., 34, 40, 42, 44, 46, forming a subset of the plurality of memory cells 14 are also connected between the column line 30 and a respective plurality of row lines 10. Each row line 10, except for the one connected to sensed cell 38, is switchingly connected to ground 20 by a respective switching device 51. Thus a voltage divider is formed by the parallel combination of sneak path cells, e.g., 34, 40, 42, 44, 46 connected in series with the particular resistance cell 38 being sensed. The sneak path cells and the sensed cell 38 are mutually connected at the node defined by column line 30. The voltage at column line 30 is applied to the sensing device 58, and more precisely, to an input of the amplifier 59 included in the sensing device. An output 65 of amplifier 59 is connected to an input 66 of a clocked comparator/latch 67 within the latch multiplexer and buffer circuit 63. The clocked latch 67 includes a clock input 68 connected to a source of a clock signal 73 and a reference voltage input 55. The reference voltage input 55 is connected to a source of a reference voltage that defines the transition between a logic one voltage and a logic zero voltage. The clocked comparator/latch also includes an output 69 connected to an input 70 of a multiplexer 71. An output 72 of multiplexer 71 is connected to an input 74 of a buffer circuit 75. An output 76 of the buffer circuit 75 is connected to the output line 64. It should be noted that, although shown together, the comparator/latch multiplexer and buffer may be implemented separately.

In an exemplary implementation, the resistance of selected resistive memory cell 38 ranges from about 900 Ω to about 1.1 MΩ. In various embodiments prepared using current technology, memory cell resistance may be found in a range from about 900 KΩ to about 1 MΩ in the low resistance state and from about 950 KΩ to about 1.1 MΩ in the high resistance state. It is understood that advances in the technology of the resistive cell may yield different resistance values to which the present invention may nonetheless be effectively applied.

Figure 6:
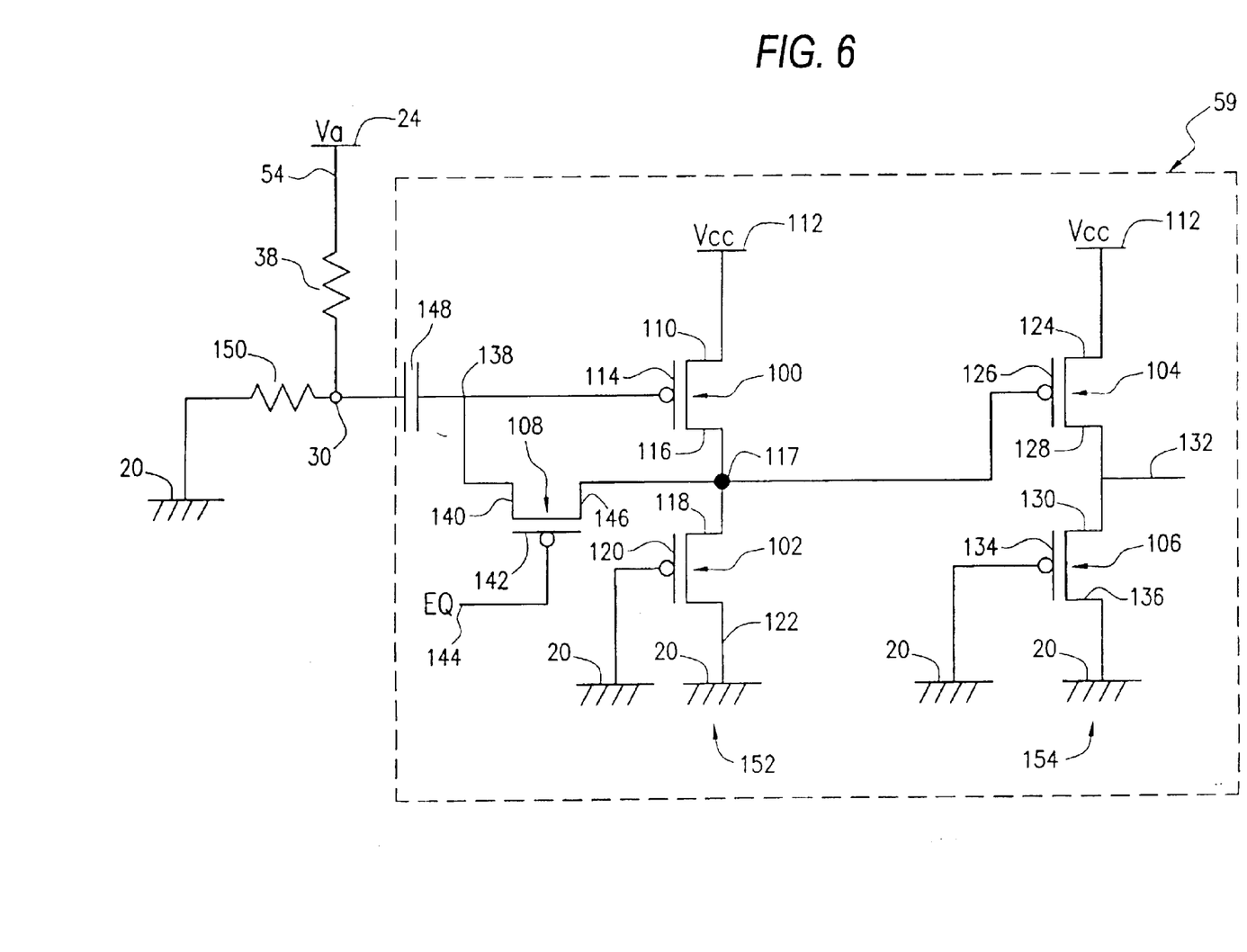
FIG. 6 shows an amplifier circuit used in one embodiment of the invention.

FIG. 6 schematically shows the circuitry of one embodiment of amplifier 59. The amplifier 59 is adapted to amplify the voltage signal formed on the column line 30 connected to the particular resistive memory cell 38 being sensed. The amplifier 59 includes first 100, second 102, third 104, fourth 106, and fifth 108 transistors. These transistors are all shown as P-type transistors, but one of skill in the art would understand that the amplifier could be implemented using N-type transistors. Transistor 100 includes a source 110 operatively connected to a source of supply potential Vcc 112, a gate 114 and a drain 116. Drain 116 is mutually connected at a node 117 with a source 118 of transistor 102. Transistor 102 also includes a gate 120 and a drain 122, both connected to ground potential 20. Transistor 104 includes a source 124 connected to Vcc 112, a gate 126 connected to node 117, and a drain 128 connected to an output node 65 of the amplifier, and to a source 130 of transistor 106. Transistor 106 also includes a gate 134 and a drain 136, both connected to ground 20. Gate 114 of transistor 100 is connected to an input node 138 of the amplifier 59, and is connected to a source 140 of transistor 108. Transistor 108 also includes a gate 142 connected to a source of an equalization signal 144, and a drain 146 connected to node 117.

A capacitor 148 is shown connected between the input node 138 of the amplifier 59 and the sensed column line 30 of the particular resistive memory cell 38 being sensed. Also shown, is a resistance 150 representing the parallel sneak path resistance of the sneak path memory cells, e.g., 34, 40, 42, 44, and 46, connected to column line 30. Resistance 150 is operatively connected between column line 30 and ground potential 20.

In operation, transistors 100 and 102 form a first stage 152 of amplifier 98 with a gain of approximately 100. Transistors 104 and 106 form a second stage 154 of amplifier 98 with a gain of approximately 10. Connected as shown, the two amplifier stages 152 and 154 yield a gain for the amplifier 59 of approximately 1000. In other embodiments of the invention, different designs having gains from about 200 to about 10,000 may be applied in place of the illustrated amplifier 59.

Referring once again to FIG. 5, assume that array voltage Va has a potential of 5 V, and that the parallel resistance 150 of the sneak path resistors, e.g., 34, 40, 42, 44, and 46, has a net of resistance of approximately 1 KΩ. If the resistance of the sensed memory element 38 is, for example, approximately 1.1 MΩ in a first state then the resulting voltage on column line 30, and therefore applied to the input of amplifier 59, will be approximately 4.5 mV. Assuming that the gain of amplifier 59 is 1000, 4.5 V will be applied to the input 66 of the clocked comparator/latch 67. Conversely, if the resistance of the sensed memory element 38 is, for example, approximately 1.0 MΩ in a second state, then the resulting voltage on column line 30 and applied to the input of amplifier 59 will be approximately 5.0 mV. After amplification by amplifier 59, 5.0 V will be applied to the input 66 of the clocked latch 67. The 0.5 V differential between the 4.5 V amplifier output associated with the first resistance state and the 5.0 V amplifier output associated with the second resistance state is large enough to be readily distinguished by clocked comparator/latch 67 prepared according to conventional methods. Thus, if the reference voltage 56 applied to the reference input 55 of the clocked comparator/latch is set to 4.75 volts, the 4.5 and 5 V outputs noted above will be readily distinguished as separate logic states.

Once a logical value has been latched onto the output 69 of the clocked comparator/latch 67. The multiplexer 71 may be operated to perform a column select in conventional fashion.

FIG. 6 shows capacitor 148 connected between column line 30 and node 138 to stop DC signals originating in the array from reaching the amplifier input 138. However, capacitor 148 may be omitted and node 138 directly connected to column line 30, allowing DC signals to pass.

As discussed above, control circuitry 61 is applied to control the activation and timing of the switching devices 51. The control circuitry also controls the application of the equalization signal 144. When the equalization signal 144 is active, the equalization transistor 108 is made conductive. This switchingly connects the gate and drain of transistor 100. It forces both transistors 100 and 102 into the saturation region of operation, and guarantees that the transistors will be properly biased for all operating temperatures and voltages.

It should be noted that the particular amplifier described above is exemplary of many amplifier designs that might be applied to the invention, and the invention is not limited to the particular circuit shown.

The invention offers lower noise operation than alternative cross point cell resistance sensing methods. As noted above, during quiescent operation the entire array is maintained at ground potential. This reduces the propensity to generate switching noise. Also, if noise is introduced to the array, it is attenuated by the voltage divider formed by the sensed memory cell 38 and the sneak path resistance 150. Thus the voltage at column line 30 can be better resolved under conditions where array voltage Va 24 includes a noise component.

Figure 7:
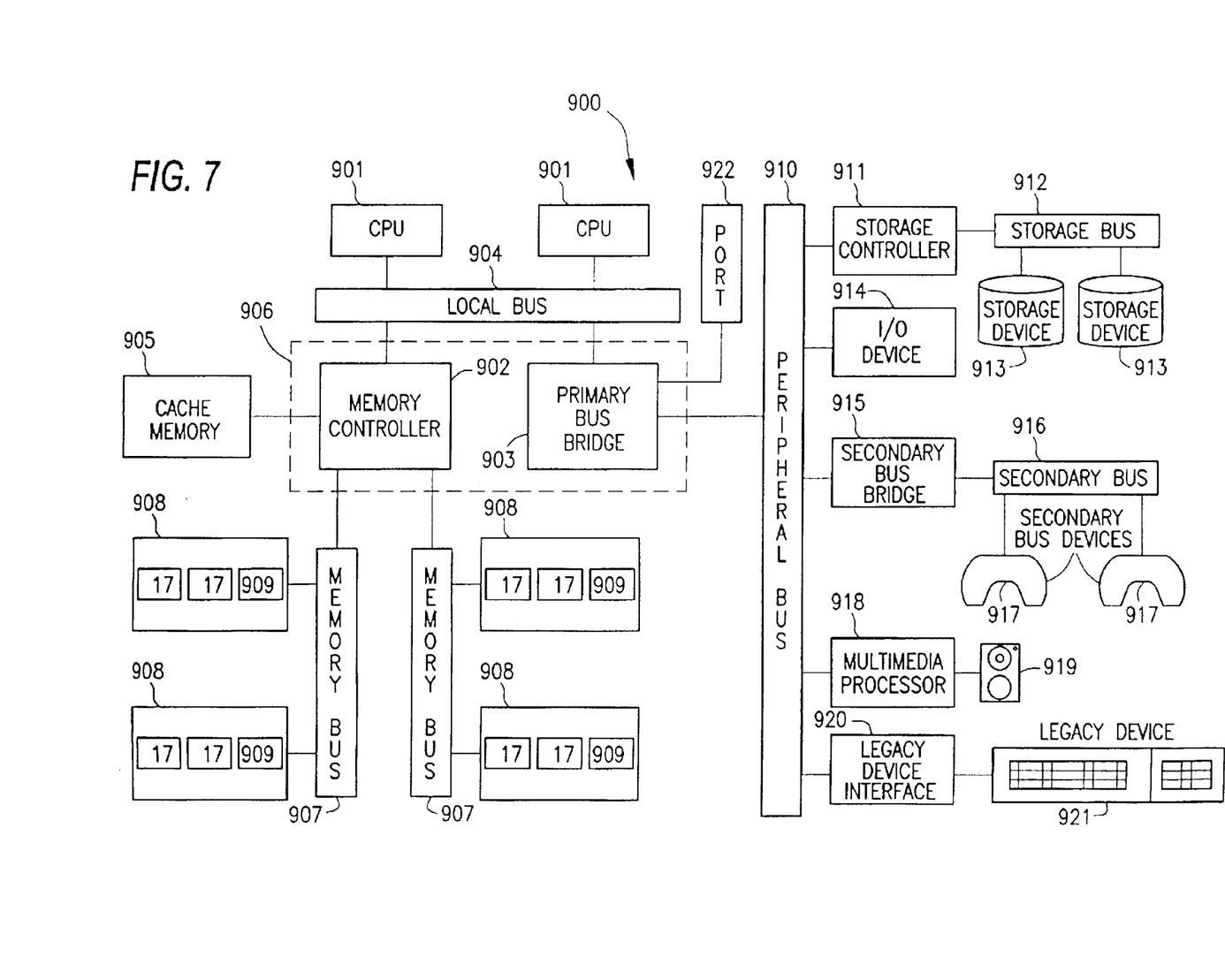
FIG. 7 shows, in block diagram form, a computer system incorporating a digital memory device including a memory array constructed according to the present invention.

FIG. 7 illustrates an exemplary processing system 900 which may utilize the memory device 17 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 17 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 9 is only an exemplary processing system with which the invention may be used while FIG. 9 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While preferred embodiments of the invention have been described in the illustrations above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A memory device comprising:

an array of magnetic resistance memory cells, each of said cells being coupled to a respective switched row conductor and a respective un-switched column conductor; and a first circuit coupled to the row and column conductors of said array, said circuit being adapted to switchingly elevate an electrical potential of one of said row conductors while maintaining at least the other row conductors of said array at ground potential during one of a read and a write operation; and a second circuit for reading a voltage on one of said un-switched column conductors connected to a selected memory cell chosen from said array of memory cells, to determine a logical state stored by said selected memory cell.

2. A memory device as defined in claim 1, wherein said first circuit maintains both the switched row conductors and the unswitched column conductors of said array at ground potential during a period when there are no read and write operations to said array.

3. A memory device as defined in claim 1, wherein said first circuit includes a switching device coupled to said switched row conductors, said switching device coupling the switched row conductors to ground during a period when there are no read and write operations to said array.

4. A memory device as defined in claim 3, wherein said first circuit is operative during a read operation to couple a selected switched row conductor to a source of potential other than ground.

5. A memory device comprising:

a plurality of first switched conductors;

a plurality of second unswitched conductors;

a plurality of memory cells, each connected between a respective one of said plurality of first switched and second unswitched conductors, each of said memory cells storing a logic state as a respective resistance value;

a bias voltage source switchingly coupled to each of said first switched conductors for biasing each of said first conductors to a first voltage;

a selection circuit for selecting one of said memory cells for a read operation, said selection circuit adapted to drive the one of said first switched conductors connected to said selected memory cell to a second voltage higher than said first voltage; and a read circuit for reading a voltage on the one of said second unswitched conductors connected to said selected memory cell to determine a logic state stored by said memory cell.

6. A memory device as defined in claim 5, wherein said selection circuit includes a plurality of switching devices respectively coupled to said plurality of first switched conductors, said switching devices being adapted for coupling said respective first switched conductors to ground.

7. A memory device as defined in claim 6, wherein said selection circuit couples a selected first switched conductor to a source of potential other than ground during a read operation.

8. A resistive memory integrated circuit comprising:

a plurality of switched row lines operatively connected to a respective plurality of switching devices, said switching devices adapted to switchingly connect said row lines alternately to ground and array voltage;

a plurality of unswitched column lines, each of said unswitched column lines disposed in non-parallel spaced relation to said plurality of switched row lines to define a plurality of overlap regions;

a plurality of amplifiers connected to said plurality of unswitched column lines respectively, said plurality of amplifiers adapted to sense a voltage on a respective unswitched column line;

a plurality of memory cells respectively connected between said switched row lines and said unswitched column lines at said overlap regions; and a control circuit operatively connected to said plurality of switching devices and adapted to switch one of said devices so as to connect a respective one of said plurality of switched row lines to said array voltage while simultaneously maintaining the other switched row lines of said plurality of row lines at ground.

9. A resistive memory integrated circuit as defined in claim 8, wherein said ground is an electrical potential substantially equal to a potential of a substrate of said integrated circuit.

10. A resistive memory integrated circuit as defined in claim 8, wherein each said amplifier includes a capacitor operatively coupled between an input of said amplifier and a respective unswitched column line.

11. A resistive memory integrated circuit as defined in claim 8, wherein each amplifier is DC coupled to a respective unswitched column line.

12. A resistive memory integrated circuit as defined in claim 8 wherein said amplifier has a gain in a range from about 500 to about 10,000.

13. A read circuit for a resistance memory integrated circuit comprising:

a switching circuit, said switching circuit adapted to temporarily arrange a selected first resistive memory cell of said integrated circuit and a plurality of further resistive memory cells of said integrated circuit in a voltage divider configuration, said first resistive memory cell having a first end connected to an elevated voltage and a second end connected to a common node of said voltage divider, each memory cell of said further plurality of resistive memory cells having a first end connected to said common node and a second end connected to ground, said first resistive memory cell of said integrated circuit and said plurality of further resistive memory cells being adapted to form an exclusive resistive path between said common node and ground; and a sensing circuit, said sensing circuit adapted to sense a voltage at said common node with respect to said ground.

14. A memory integrated circuit as defined in claim 13, wherein said sensing circuit further comprises an amplifier.

15. A memory integrated circuit as defined in claim 14, wherein said amplifier is coupled to said common node.

16. A memory integrated circuit as defined in claim 14, wherein said amplifier is DC coupled to said common node.

17. A memory integrated circuit as defined in claim 14, wherein said ground is a potential substantially equal to a potential of a substrate of said integrated circuit.

18. A memory integrated circuit as defined in claim 14, wherein said amplifier has an input connected to said common node and an output, and wherein said sensing circuit is adapted to sample and hold an electrical potential at said output.

19. A method of reading data from a resistive memory device having an array of resistive memory cells, each cell coupled to a respective switched row conductor and a respective un-switched column conductor:

maintaining said array of resistive memory cells of said device at ground potential while said device is in a quiescent state;

raising a selected switched row line of said array to a non-ground potential while said device is in a read state; and amplifying a voltage on a selected unswitched column line of said array while said device is in said read state to read data from a selected resistive memory cell.

20. A method of measuring a logic state of a resistive memory cell comprising:

switchingly connecting a plurality of switched row lines of a resistive memory integrated circuit to a source of ground potential;

at a sensing time, switching a selected one of said plurality of switched row lines to a source of a non-ground potential, said selected row line being connected to a selected resistive memory cell; and sensing a voltage of a selected unswitched column line of said memory integrated circuit connected to said selected resistive memory cell, said voltage corresponding to an electrical potential between said ground and non-ground potentials, said voltage representing a logic state of said selected resistive memory cell.

21. A method of sensing a resistance state of a resistive memory cell comprising:

switchingly connecting a plurality of switched row lines to a ground potential, said plurality of switched row lines being connected to a respective plurality of resistive memory cells at a plurality of respective first ends of said memory cells, said plurality of resistive memory cells including a respective plurality of second ends mutually connected to an unswitched column line;

switchingly connecting one of said plurality of switched row lines to an elevated potential at a switching time; and sensing a voltage on said unswitched column line during a measuring time period after said switching time, said voltage substantially determined by a resistance of one resistive memory cell connected to said switched row line.

22. A method of sensing a memory cell resistance comprising:

switchingly arranging said first resistive memory cell as a first branch of a voltage divider, said voltage divider including a common node and a second branch, said second branch having a plurality of further memory cells with a respective plurality of first ends, said plurality of first ends mutually connected to said common node, said plurality of memory cells having a respective plurality of second ends, said second ends respectively coupled to a source of ground potential, said first memory cell having a first end connected to said common node and a second end switchingly connected to a source of elevated potential; and sensing a voltage on said common node with respect to said ground potential through an unswitched conductor.

23. A method of sensing a logic state stored in a resistive memory cell comprising:

arranging a first resistive memory cell in a voltage divider, said voltage divider including, in addition to said first resistive memory cell, a plurality of further resistive memory cells each having a first end coupled to said first resistive memory cell through an unswitched signal line and a second end coupled to ground;

flowing an electrical current through said voltage divider;

measuring an output voltage of said voltage divider; and relating said measured output voltage to a logic state of said first cell.

24. A method as defined in claim 23 wherein said voltage divider is operatively connected between a source of ground potential and a source of elevated potential, said first cell being disposed relatively electrically closer to said source of elevated potential than said plurality of further cells during said measuring.

25. A method of reading digital data stored as a state of a resistive memory cell comprising:

setting the respective potentials of a plurality of switched row lines to ground potential, said switched row lines each being coupled to a respective plurality of resistive memory cells; setting the potential of a selected one of said plurality of switched row lines to a second potential above ground;

sensing a potential of an unswitched column line coupled to one end of one memory cell of said plurality of memory cells, said one cell being coupled at another end to said switched row line; and determining a logic state stored by said one cell using said sensed potential.

26. A method as defined in claim 25, wherein said semiconductor substrate supporting said switched row lines and said unswitched column lines is adapted to reside at said ground potential.

27. A method as defined in claim 25 wherein said potential of said unswitched column line is substantially a function of a resistance of said one memory element during said sensing.

28. A method as defined in claim 27 wherein said resistance of said one memory element is a function of a magnetization state of said one memory element.

29. A computer system comprising:

a central processor; and a memory unit operatively connected to exchange data with said central processor, said memory unit including at least one memory device having an array of magnetic resistance memory cells, said array adapted to be maintained at ground potential during quiescent operation of said array and to dissipate a charge disposed on a floating unswitched column conductor through said resistance memory cells during a default condition when a row line of said memory device is connected to ground.

30. A computer system as defined in claim 29 wherein said at least one memory device comprises:

a first plurality of row conductors;

a second plurality of unswitched column conductors; and circuitry coupled to said row conductors adapted to connect one of said row conductors to a non-ground potential during a read operation of said array.

31. A computer system as defined in claim 30 wherein said at least one memory device comprises:

an amplifier adapted to sense a voltage at one end of one of said memory cells, said one of said memory cells coupled at another end to said one of said row conductors.

32. A computer system as defined in claim 31 wherein said amplifier comprises:

an input node;

an output node; and electronic circuitry coupled between said input node and said output node, the circuitry adapted to provide an amplifier gain of between about 200 and about 10,000.

33. A computer system as defined in claim 32 comprising:

a capacitor coupled between said one end of said one of said memory cells and said input node.

34. A computer system as defined in claim 32 comprising;

a latched clocked comparator having a sensing input coupled to said output node, said latched clocked comparator having a reference input adapted to receive a reference voltage, a clock input adapted to receive a clock signal, and a latched output, said latched clocked comparator adapted to maintain a logical state on said latched output after receiving a transition signal at said clock input, said logical state reflecting a result of a comparison between a voltage received at said sensing input and a voltage received at said reference input.

* * * * *

UNITED STATES PATENT AND TRADEMARK OFFICE
CERTIFICATE OF CORRECTION

PATENT NO. : 6,809,981 B2
DATED : October 26, 2004
INVENTOR(S) : R. J. Baker

It is certified that error appears in the above-identified patent and that said Letters Patent is hereby corrected as shown below:

Title page,
Item [57], ABSTRACT,
Line 1, "having" should read -- has --;
Line 10, "amplified" should read -- amplifier --.

Column 7,
Line 9, 11, 22 and 25 reads "an" should read -- a --;
Line 29, reads "one additional" should read -- one of such additional --;

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,809,981 B2
DATED : October 26, 2004
INVENTOR(S) : R. J. Baker It is certified that error appears in the above-identified patent and that said Letters Patent is hereby corrected as shown below:

Column 7,
Line 29, reads "devices such as" should read -- devices as --.

Signed and Sealed this

Thirtieth Day of August, 2005

JON W. DUDAS
*Director of the United States Patent and Trademark Office*